United States Patent [19]

Furukawa et al.

[11] Patent Number: 5,124,779
[45] Date of Patent: Jun. 23, 1992

[54] SILICON CARBIDE SEMICONDUCTOR DEVICE WITH OHMIC ELECTRODE CONSISTING OF ALLOY

[75] Inventors: Katsuki Furukawa, Sakai; Akira Suzuki; Yoshihisa Fujii, both of Nara, all of Japan

[73] Assignee: Sharp Kabushiki Kaisha, Osaka, Japan

[21] Appl. No.: 601,245

[22] Filed: Oct. 17, 1990

[30] Foreign Application Priority Data

Oct. 18, 1989 [JP] Japan .................. 1-272629

[51] Int. Cl.⁵ .................. H01L 23/48; H01L 29/46; H01L 29/20; H01L 29/22
[52] U.S. Cl. .................. 357/67; 357/23.2; 357/61
[58] Field of Search .................. 357/68, 65, 61, 23.2

[56] References Cited

U.S. PATENT DOCUMENTS

| | | | |
|---|---|---|---|
| 3,063,876 | 7/1959 | May et al. | 357/61 |
| 3,121,829 | 2/1964 | Huizing et al. | 357/61 |
| 3,201,666 | 8/1957 | Hall | 357/67 |
| 3,409,467 | 11/1968 | Foley | 357/67 |
| 3,900,598 | 8/1975 | Hall et al. | 357/67 |
| 3,972,749 | 8/1976 | Pavlichenko | 357/67 |
| 4,267,012 | 5/1981 | Pierce et al. | 357/67 |
| 4,918,497 | 4/1990 | Edmond | 357/17 |
| 4,990,994 | 2/1991 | Furukawa et al. | 357/67 |
| 5,006,914 | 4/1991 | Beetz, Jr. | 357/49 |

OTHER PUBLICATIONS

*Japanese Journal of Applied Physics*, vol. 25, No. 7, Jul. 1986, pp. L592-L594.
W. V. Muench et al., "Breakdown Field in Vapor-Grown Silicon Carbide Junctions", *Journal of Applied Physics*, vol. 48, 11, Nov. 1977, pp. 4831-4833.

*Primary Examiner*—Jerome Jackson, Jr.
*Assistant Examiner*—Donald L. Monin
*Attorney, Agent, or Firm*—David G. Conlin; Robert M. Asher

[57] ABSTRACT

A silicon carbide semiconductor device is disclosed which includes a silicon carbide single-crystal layer and at least one ohmic electrode in contact with the silicon carbide single-crystal layer, wherein the ohmic electrode is made of a titanium-aluminum alloy. Also disclosed is a method of producing the silicon carbide semiconductor device.

4 Claims, 2 Drawing Sheets

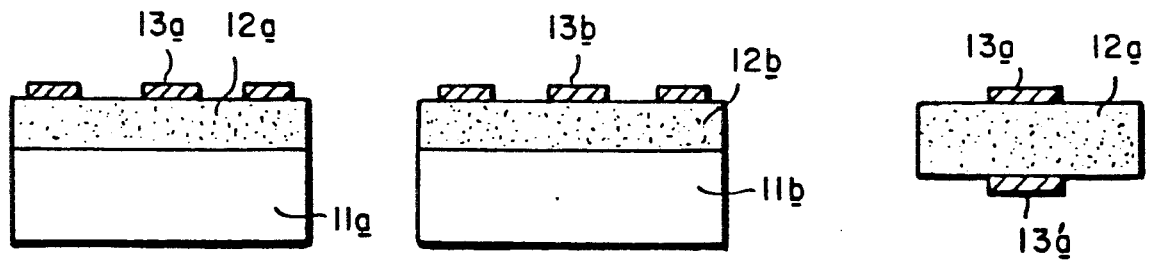
FIG.1A   FIB.1B   FIG.2
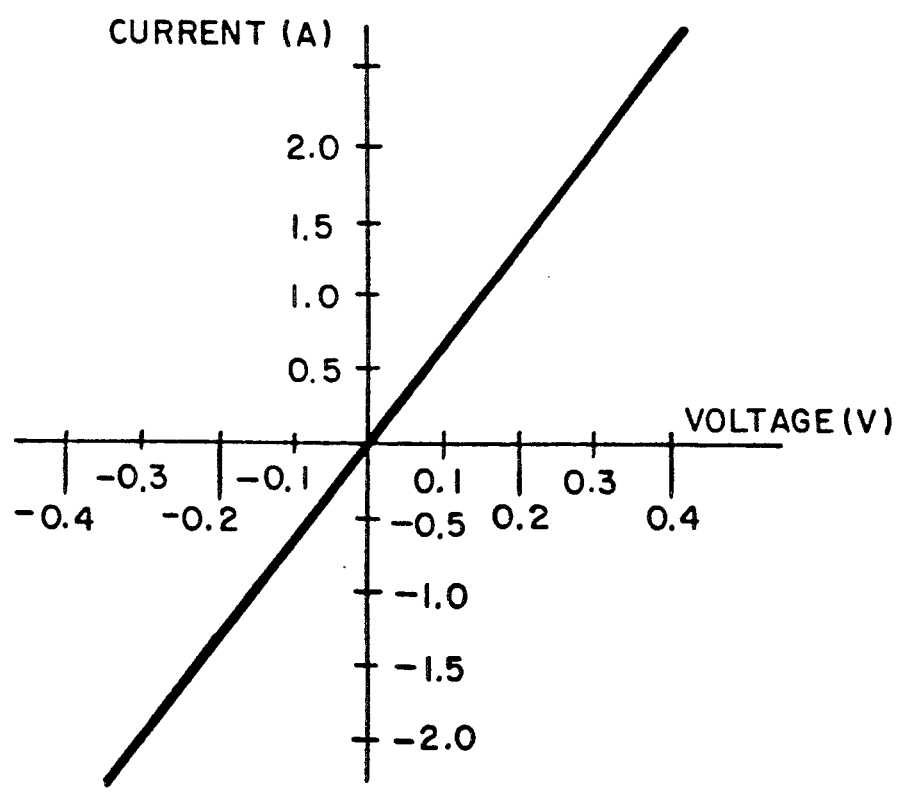
FIG.3

SILICON CARBIDE SEMICONDUCTOR DEVICE WITH OHMIC ELECTRODE CONSISTING OF ALLOY

BACKGROUND OF THE INVENTION

1. Field of the invention

This invention relates to a silicon carbide semiconductor device, and more particularly, it relates to a silicon carbide semiconductor device having at least one ohmic electrode in contact with a silicon carbide single-crystal layer. It also relates to a method of producing such a silicon carbide semiconductor device.

2. Description of the prior art

Silicon carbide (SiC) is a semiconductor material with a wide band gap of 2.2 to 3.3 electron-volts (eV) depending on its crystal structure. Furthermore, silicon carbide is thermally, chemically, and mechanically quite stable, and can be of either p-type or n-type with high stability, which is a rare case with wide-gap semiconductor materials. Therefore, semiconductor devices having a silicon carbide single-crystal layer and at least one ohmic electrode formed in contact with the silicon carbide single-crystal layer for electrical connection to external circuits are expected to have wide applications in the field of electronics, such as optoelectric transducers and semiconductor devices which can be used under severe conditions of high temperature, high output drive, and radiation exposure.

Recently, the inventors have invented several silicon carbide semiconductor devices, and filed for example, Japanese Patent Applications No. 1-221207, No. 1-145617 and No. 1-145618, which correspond to U.S. patent applications Ser. No. 574,487 (filed on Aug. 28, 1990), No. 533,573 (filed on Jun. 5, 1990) and No. 534,046 (Jun. 6, 1990), respectively. These silicon carbide semiconductors have aluminum (Al) wiring electrodes formed on a silicon carbide single-crystal layer.

Other examples of the ohmic electrode formed on a silicon carbide single-crystal layer include those obtained by vacuum deposition of nickel (Ni) in the case of n-type silicon carbide single-crystal layers or a eutectic material of aluminum (Al) and silicon (Si) in the case of p-type silicon carbide single-crystal layers on the surface thereof, and then alloying at a high temperature of around 1100° C. (see, e.g., "Breakdown Field in Vapor-Grown Silicon Carbide P-N Junctions," Journal of Applied Physics, Vol. 48, No. 11, pp. 4831–4833(1977)). Also included are titanium electrodes formed by vacuum deposition or the like (see, e.g., Japanese Laid-open Patent Publication No. 62-71271 which corresponds to U.S. patent application Ser. No. 910,482 filed on Sept. 23, 1986).

However, when ohmic electrodes as mentioned above are used, the step of alloying at a high temperature of about 1100° C. causes the following problems: (1) the cohesion of electrode metal occurs which makes it difficult to form a uniform ohmic electrode; and (2) stress is applied by the cohesion of electrode metal to the silicon carbide single-crystal layer in contact therewith, resulting in a reduction of crystallinity due to increased crystal deformation and dislocation. Moreover, vacuum deposition of titanium introduces the following problems: (1) it is difficult to form thick films for use as an electrode because of its high melting point of 1720° C.; and (2) it is necessary to form another deposited layer of aluminum or the like because of difficulty in direct connection with external wirings.

SUMMARY OF THE INVENTION

The silicon carbide semiconductor device of this invention, which overcomes the above-discussed and numerous other disadvantages and deficiencies of the prior art, comprises a silicon carbide single-crystal layer and at least one ohmic electrode in contact with the silicon carbide single-crystal layer, wherein the ohmic electrode is made of a titanium-aluminum alloy.

In a preferred embodiment, the aforementioned titanium-aluminum alloy has an aluminum content of 15 to 65 percent by weight based on the total weight of the alloy.

In a preferred embodiment, the aforementioned silicon carbide single-crystal layer is of the 3C or 6H type.

In a preferred embodiment, the aforementioned silicon carbide semiconductor device further comprises a source region and a drain region, both of which are formed in the silicon carbide single-crystal layer, and a gate electrode formed above the silicon carbide single-crystal layer between the source region and the drain region, wherein the ohmic electrode is in contact with at least one of the source region and the drain region.

The method of producing a silicon carbide semiconductor device having at least one ohmic electrode made of a titanium-aluminum alloy, according to this invention, which overcomes the above-discussed and numerous other disadvantages and deficiencies of the prior art, comprises the step of forming the ohmic electrode by vacuum deposition of a titanium-aluminum alloy on the surface of a silicon carbide single-crystal layer with no subsequent heat treatment at high temperatures of about 1100° C. or more.

In a preferred embodiment, the substrate temperature during the vacuum deposition is set at room temperature.

In a preferred embodiment, the aforementioned ohmic electrode is subjected to heat treatment at a low temperature of 1000° C. or less.

Thus, the invention described herein makes possible the objectives of (1) providing a silicon carbide semiconductor device having at least one ohmic electrode which is made of a titanium-aluminum alloy, thereby solving all the problems caused by cohesion of electrode metal; (2) providing a silicon carbide semiconductor device having at least one ohmic electrode which is made of a titanium-aluminum alloy, thereby attaining a reliable ohmic contact with a silicon carbide single-crystal layer; (3) providing a silicon carbide semiconductor device having at least one ohmic electrode which is made of a titanium-aluminum alloy with a low melting point, thereby facilitating the formation of ohmic electrodes; (4) providing a silicon carbide semiconductor device having at least one ohmic electrode made of a titanium-aluminum alloy, which requires no electrodes for electrical connection to external wirings, thereby attaining a simple device structure; (5) providing a method of producing a silicon carbide semiconductor device having at least one ohmic electrode made of a titanium-aluminum alloy, which increases the device reliability and makes a great contribution in finding a practical application of silicon carbide semiconductor devices in the field of electronics; and (6) providing a method of producing a silicon carbide semiconductor device having at least one ohmic electrode, which requires no subsequent heat treatment of the ohmic electrode at high temperatures.

BRIEF DESCRIPTION OF THE DRAWINGS

This invention may be better understood and its numerous objectives and advantages will become apparent to those skilled in the art by reference to the accompanying drawings as follows:

FIG. 1A is a schematic sectional view showing a silicon carbide semiconductor device of this invention.

FIG. 1B is a schematic sectional view showing another silicon carbide semiconductor device of this invention.

FIG. 2 is a schematic sectional view showing a sample for measurement of current-voltage characteristics.

FIG. 3 is a graph showing the current-voltage characteristics.

DETAILED DESCRIPTION OF THE INVENTION

Figure 4A:
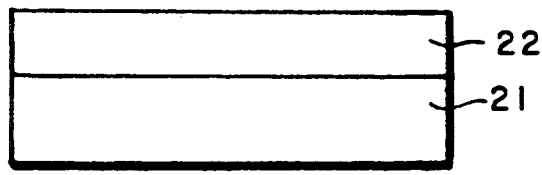
FIGS. 4A–4D are schematic sectional views showing the production of still another silicon carbide semiconductor device of this invention.

In the silicon carbide semiconductor device of this invention, the titanium-aluminum alloy makes a stable ohmic contact with the silicon carbide single-crystal layer. The film of this alloy adheres tightly to the silicon carbide single-crystal layer, thereby facilitating the direct connection to external wirings. The titanium-aluminum alloy has a lower melting point than that of titanium, because it contains aluminum which has a low melting point (660° C.). Therefore, thick films can readily be formed by vacuum deposition, thus making it possible to form a titanium-aluminum alloy film as an ohmic electrode which adheres closely and tightly to the surface of the silicon carbide single-crystal layer.

In the titanium-aluminum alloy, the titanium accounts for the ohmic characteristics and close adhesion to the silicon carbide single-crystal layer, while the aluminum accounts for the low melting point. The composition ratio of the titanium-aluminum alloy is determined to satisfy the requirements for ohmic characteristics and close adhesion as an electrode and for low melting point as a vacuum deposition material. When the content of aluminum is less than 15 percent by weight based on the total weight of the alloy, the deposition temperature of the alloy is only slightly different from that of titanium, so it is difficult to produce a thick film of the alloy. When the content of aluminum exceeds 65 percent by weight based on the total weight of the alloy, aluminum is present together with $TiAl_3$ which is one kind of titanium-aluminum alloy. In this case, aluminum which has poor adhesion is deposited first at the time of vapor deposition, resulting in poor adhesion. Therefore, it is preferred that the titanium-aluminum alloy should have an aluminum content of 15 to 65 percent by weight based on the total weight of the alloy.

DESCRIPTION OF THE PREFERRED EMBODIMENTS

The invention will be further explained below with reference to the following examples which are not intended to restrict the subject matter of the invention.

EXAMPLE 1

FIG. 1A shows a silicon carbide semiconductor device of this invention, which includes a silicon single-crystal substrate 11a and a 3C silicon carbide single-crystal layer 12a formed thereon by chemical vapor deposition. FIG. 1B shows another silicon carbide semiconductor device of this invention, which includes a silicon carbide single-crystal substrate 11b and a 6H silicon carbide single-crystal layer 12b formed thereon by chemical vapor deposition. In these devices, titanium-aluminum alloy electrodes 13a and 13b are disposed as an ohmic electrode on the silicon carbide single-crystal layers 12a and 12b, respectively.

These silicon carbide semiconductor devices can be produced in the same manner as described below. Hence, the following will describe only the production of the device shown in FIG. 1A.

First, on a silicon single-crystal substrate 11a, a 3C silicon carbide single-crystal layer 12a doped with n-type impurities was formed by chemical vapor deposition. Then, on the surface of the silicon carbide single-crystal layer 12a which is to be provided with ohmic electrodes, a titanium-aluminum alloy film with a thickness of 100 nm was deposited with a mask by resistance heating, resulting in a patterned titanium-aluminum alloy electrode 13a. At this time, a commercially available titanium-aluminum alloy having a titanium-to-aluminum ratio of 65:35 (wt %) was used as the deposition material.

The titanium-aluminum alloy electrode 13a formed by vacuum deposition exhibited very close adhesion to the underlying silicon carbide single-crystal layer 12a with no subsequent heat treatment. The titanium-aluminum alloy electrode 13a adhered quite closely to the silicon carbide single-crystal layer 12a without showing a structure caused by non-uniformity of composition. Furthermore, the titanium-aluminum alloy electrode 13a was formed in a short time and there was no need to form another metal layer thereon, so that the direct connection to external wirings was readily made.

FIG. 3 shows the current-voltage characteristic of a silicon carbide single-crystal semiconductor device of this invention, which was measured between the silicon carbide single-crystal layer and the titanium-aluminum alloy electrode of a sample as shown in FIG. 2. This sample was produced as follows. First, the silicon single-crystal substrate 11a was removed from the silicon carbide single-crystal layer 12a of the device as shown in FIG. 1A. Then, on the exposed surface of the silicon carbide single-crystal layer 12a, a titanium-aluminum alloy electrode 13'a was formed in the same manner as mentioned above.

The measured resistivity of the silicon carbide single-crystal layer 12a of the n-type was in the range of 0.1 to 1.0 ohm-cm and the current-voltage characteristics show that the contact resistance between the silicon carbide single-crystal layer 12a and the titanium-aluminum alloy electrode 13a or 13'a is extremely small.

Although the above example described only the case of a silicon carbide single-crystal layer of the n-type, the same results were obtained with a silicon carbide single-crystal layer doped with p-type impurities. Furthermore, in place of the deposition by resistance heating, electron beam deposition or sputtering deposition was used to form a titanium-aluminum alloy electrode, having the same results as mentioned above. In these cases, the thickness of the titanium-aluminum alloy electrode was set at 50 to 100 nm.

In this example, the substrate temperature during vacuum deposition was set at room temperature, so the crystallinity of the silicon carbide single-crystal layer did not deteriorate as is seen in the conventional case where annealing is performed at a temperature of around 1100° C. Furthermore, although no heat treatment was performed after formation of the titanium-aluminum alloy electrode, a comparison with a case where heat treatment was performed at a temperature of 1000° C. or less did not show any change in the ohmic characteristic. Depending on the composition and crystal state of the titanium-aluminum alloy electrode, heat treatment may be performed at 1000° C.

EXAMPLE 2

FIGS. 4A to 4D show the production of an insulated-gate field-effect transistor (MOSFET) which is still another silicon carbide semiconductor device of this invention. This device was produced as follows.

First, as shown in FIG. 4A, on a silicon single-crystal substrate 21, a β-type silicon carbide single-crystal layer 22 (the thickness thereof being μm) doped with aluminum as a p-type impurity was grown by chemical vapor deposition. As the source gases, silane ($SiH_4$) and propane ($C_3H_8$) were used. The substrate temperature was set at 1350° C. Also, trimethyl aluminum (TMA) as a source of the p-type impurity was introduced into a reaction tube during the growth of the silicon carbide single-crystal layer, thereby obtaining the β-type silicon carbide single-crystal layer 22 of the p-type with a carrier concentration of $5 \times 10^{16}$ cm$^{-3}$. The amount of trimethyl aluminum to be added can readily be determined by those skilled in the art on the basis of their ordinary knowledge.

Figure 4B:
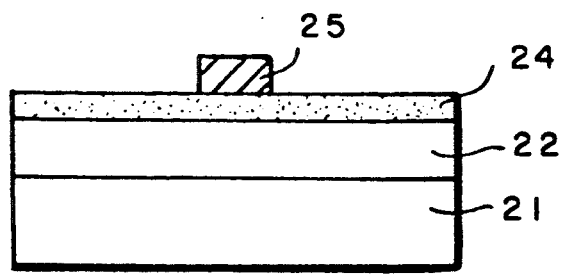

Then, on the β-type silicon carbide single-crystal layer 22 of the p-type, a silicon thermal oxide film 24 (the thickness thereof being 50 nm) was formed by heat treatment at 1100° C. in an atmosphere of oxygen for 3 hours. As shown in FIG. 4B, at the prescribed position on the silicon thermal oxide film 24, a gate electrode 25 composed of a polysilicon film (the thickness thereof being 200 nm) was formed by a lift-off technique using plasma chemical vapor deposition. As the source gas, silane ($SiH_4$) was used and the substrate temperature was set at 800° C. Also, phosphine ($P_H3$) was added to the source gas during the growth of the polysilicon film, thereby obtaining a polysilicon film with a low resistivity of $5 \times 10^{-3}$ ohm-cm. The amount of phosphine to be added can readily be determined by those skilled in the art on the basis of their ordinary knowledge.

Figure 4C:
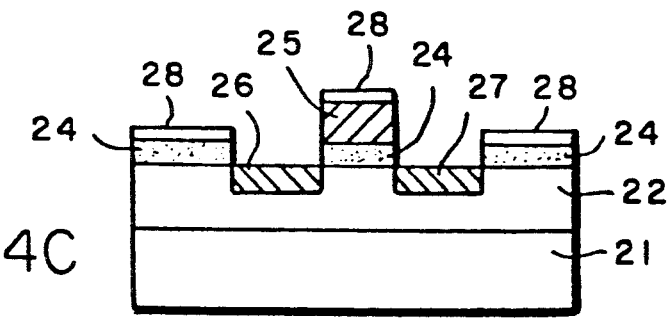
Figure 4D:
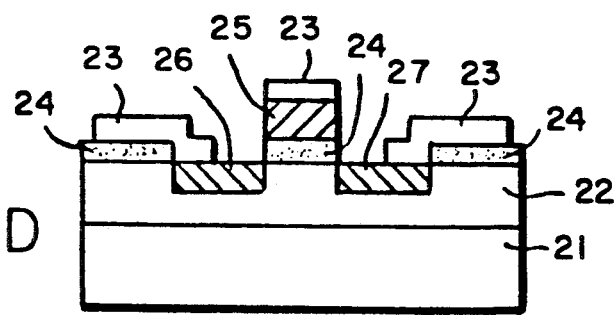

Next, a photoresist solution was applied to the entire surface and patterned by photolithography to form a photoresist layer 28, after which a gate region (the length thereof being 10 μm) was formed by etching. Then, nitrogen ions were implanted in the β-type silicon carbide single-crystal layer 22 of the p-type to form an n-type source region 26 and drain region 27 as shown in FIG. 4C. The amount of silicon ions implanted was $3 \times 10^{14}$ cm$^{-2}$.

After the photoresist layer 28 was removed, heat treatment was performed at 1100° C. in an atmosphere of argon for 30 minutes, whereby the resistivity of the source region 26 and drain region 27 was allowed to decrease. Finally, on the gate electrode 25, source region 26, and drain region 27, titanium-aluminum alloy electrodes 28 with a thickness of 100 nm were formed, respectively, by electron beam deposition, resulting in an n-channel inverted-type MOS field-effect transistor using β-type silicon carbide. As the deposition material, a commercially available titanium-aluminum alloy having a titanium-to aluminum ratio of 65:35 (wt %) was used, and the substrate temperature was set at room temperature.

In this example, no heat treatment at high temperatures accompanying the conventional formation of electrodes was used, so there was no change or deterioration of the device characteristics caused by heat treatment. Furthermore, the titanium-aluminum alloy electrode of this example exhibited excellent ohmic characteristics and excellent close adhesion without causing separation during use, thereby obtaining excellent device characteristics. In addition, the formation of electrodes was readily conducted, because the deposition of a titanium-aluminum alloy was easy and there was no need to form another metal later such as an aluminum layer for connection to external wirings as in the conventional cases.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A silicon carbide semiconductor device comprising a silicon carbide single-crystal layer and at least one ohmic electrode in contact with the silicon carbide single-crystal layer, wherein the ohmic electrode consists of a titanium-aluminum alloy.

2. A silicon carbide semiconductor device according to claim 1, wherein the titanium-aluminum alloy has an aluminum content of 15 to 65 percent by weight based on the total weight of the alloy.

3. A silicon carbide semiconductor device according to claim 1, wherein the silicon carbide single-crystal layer is of the 3C or 6H type.

4. A silicon carbide semiconductor device according to claim 1, further comprising a source region and a drain region, both of which are formed in the silicon carbide single-crystal layer, and a gate electrode formed above the silicon carbide single-crystal layer between the source region and the drain region, wherein the ohmic electrode is in contact with at least one of the source region and the drain region.

* * * * *